United States Patent
Zanchi et al.

(10) Patent No.: US 12,362,754 B2
(45) Date of Patent: Jul. 15, 2025

(54) PHASE LOCKED LOOP USING ADAPTIVE FILTER TUNING FOR RADIATION HARDENING

(71) Applicant: The Boeing Company, Arlington, VA (US)

(72) Inventors: Alfio Zanchi, Seattle, WA (US); Parham Khajeh Hesamaddin, Irvine, CA (US)

(73) Assignee: The Boeing Company, Arlington, VA (US)

( * ) Notice: Subject to any disclaimer, the term of this patent is extended or adjusted under 35 U.S.C. 154(b) by 0 days.

(21) Appl. No.: 18/320,130

(22) Filed: May 18, 2023

(65) Prior Publication Data
US 2023/0403017 A1  Dec. 14, 2023

Related U.S. Application Data

(60) Provisional application No. 63/366,061, filed on Jun. 8, 2022.

(51) Int. Cl.
*H03L 7/107* (2006.01)
*H03L 7/089* (2006.01)
(Continued)

(52) U.S. Cl.
CPC .......... *H03L 7/1075* (2013.01); *H03L 7/0891* (2013.01); *H03L 7/095* (2013.01); *H03L 7/099* (2013.01); *H03L 2207/50* (2013.01)

(58) Field of Classification Search
CPC . H03L 7/08; H03L 7/085; H03L 7/093; H03L 7/091; H03L 7/095; H03L 7/099;
(Continued)

(56) References Cited

U.S. PATENT DOCUMENTS

| | | | | |
|---|---|---|---|---|
| 7,002,415 B2* | 2/2006 | Tsyrganovich | ...... | H03D 13/001 331/1 R |
| 7,548,122 B1* | 6/2009 | Groe | ...... | H03L 7/1075 331/34 |
| 7,633,322 B1* | 12/2009 | Zhuang | ...... | H03L 7/18 327/147 |

(Continued)

OTHER PUBLICATIONS

Kratyuk, V. et al., "A Design Procedure for All-Digital Phase-Locked Loops Based on a Charge-Pump Phase-Locked-Loop Analogy," IEEE Transactions on Circuits and Systems II: Express Briefs, vol. 54, No. 3, Mar. 19, 2007, 5 pages.
(Continued)

*Primary Examiner* — Diana J. Cheng
(74) *Attorney, Agent, or Firm* — Alleman Hall & Tuttle LLP

(57) ABSTRACT

A phase-locked loop is disclosed. The phase-locked loop includes a phase error detector, an event detector, a loop filter, and an oscillator. The phase error detector is configured to receive an input signal and a feedback signal and output a phase error signal. The event detector is configured to detect a loss of lock condition based on the phase error signal. The loop filter is configured to filter the phase error signal to generate a filtered control signal based on a first set of filter parameter values, and in response to the loss of lock condition, filter the phase error signal to generate the filtered control signal based on a second set of filter parameter values different from the first set of filter parameter values. The oscillator is configured to output an output signal having a phase that is based on the filtered control signal.

20 Claims, 8 Drawing Sheets

(51) Int. Cl.
*H03L 7/095* (2006.01)
*H03L 7/099* (2006.01)

(58) Field of Classification Search
CPC ......... H03L 7/0991; H03L 7/10; H03L 7/105;
H03L 7/107; H03L 7/1075
See application file for complete search history.

(56) References Cited

U.S. PATENT DOCUMENTS 9,967,086 B2 * 5/2018 Su ........................... H03D 3/06
10,790,833 B1 9/2020 Zanchi et al.

OTHER PUBLICATIONS

Loveless, T. et al., "A Hardened-by-Design Technique for RF Digital Phase-Locked Loops," IEEE Transactions on Nuclear Science, vol. 53, No. 6, Dec. 19, 2006, 7 pages.

Prinzie, J. et al., "Comparison of a 65 nm CMOS Ring- and LC-Oscillator Based PLL in Terms of TID and SEU Sensitivity," IEEE Transactions on Nuclear Science, vol. 64, No. 1, Oct. 12, 2016, 8 pages.

Rezzak, N. et al., "RTG4 PLL See Test Results," Microsemi, Jul. 10, 2017, 8 pages.

Staszewski, R. et al., "All-digital PLL and transmitter for mobile phones," IEEE Journal of Solid-State Circuits, vol. 40, No. 12, Dec. 5, 2005, 14 pages.

Topper, A. et al., "NASA Goddard Space Flight Center's Compendium of Total Ionizing Dose, Displacement Damage Dose, and Single-Event Effects Test Results," Proceedings of the 56th IEEE International Nuclear and Space Radiation Effects Conference, Jul. 8, 2019, San Antonio, Texas, 10 pages.

Yin, W. et al., "A TDC-Less 7 mW 2.5 GB/s Digital CDR With Linear Loop Dynamics and Offset-Free Data Recovery," IEEE Journal of Solid-State Circuits, vol. 46, No. 12, Oct. 28, 2011, 11 pages.

* cited by examiner

PHASE LOCKED LOOP USING ADAPTIVE FILTER TUNING FOR RADIATION HARDENING

CROSS REFERENCE TO RELATED APPLICATIONS

This application claims priority to U.S. Provisional Patent Application Ser. No. 63/366,061, filed Jun. 8, 2022, the entirety of which is hereby incorporated herein by reference for all purposes.

GOVERNMENT LICENSE RIGHTS

This invention was made with Government support under (252.227-7038) awarded by the US Navy. The Government has certain rights in this invention.

FIELD

The present disclosure relates generally to the field of electronic circuitry, and more specifically to phased-locked loops.

BACKGROUND

Electronic circuits are a powerful and efficient way of processing data and are used in many ground-based and space-based apparatuses. A special class of ground-based applications (military, medical, and energy/nuclear applications) as well as space-based applications are subject to a number of functional challenges stemming from radiation environments. One such problem is the possibility of malfunction of the electronic circuit due to heavy ion particle interactions, referred to as Single-Event Effects (SEEs). Another issue concerns instantaneous radiation bursts (e.g., that follow nuclear explosions) that lead to rapid irradiation phenomena, referred to as Dose Rate Upsets (DRUs).

An especially sensitive class of electronic circuits is the one of timing circuits, i.e., blocks generating a synchronizing signal or clock, or manipulating signals that embed information about events in the timing of their transition edges. Prominent amongst these circuits is the Phase-Locked Loop (PLL), which is used to lock onto a very stable external signal and generate a timing signal output that is synchronous to the input signal transitions. Additionally, PLLs can be configured to provide various modifications to timing signals, such as multiplying in frequency (e.g., a synthesizer PLL), or more limited in bandwidth (e.g., a jitter-cleaning PLL), or of the same frequency but with better driving capability and identical phase (e.g., local clock tree synchronizer/phase stabilizer PLL), among various other types of PLLs.

SUMMARY

A phase-locked loop is disclosed. The phase-locked loop includes a phase error detector, an event detector, a loop filter, and an oscillator. The phase error detector is configured to receive an input signal and a feedback signal and output an error signal reflecting a difference of phase between the input signal and the feedback signal. The event detector is configured to detect a loss of lock condition based at least on the phase error signal. The loop filter is configured to filter the phase error signal to generate a filtered control signal based at least on a first set of filter parameter values; and, in response to the loss of lock condition, filter the phase error signal to generate the filtered control signal based at least on a second set of filter parameter values different from the first set of filter parameter values. The oscillator is configured to output an output signal having a phase that is based at least on the filtered control signal.

The features, functions, and advantages that have been discussed can be achieved independently in various embodiments or may be combined in yet other embodiments, further details of which can be seen with reference to the following description and drawings.

DETAILED DESCRIPTION

Figure 1:
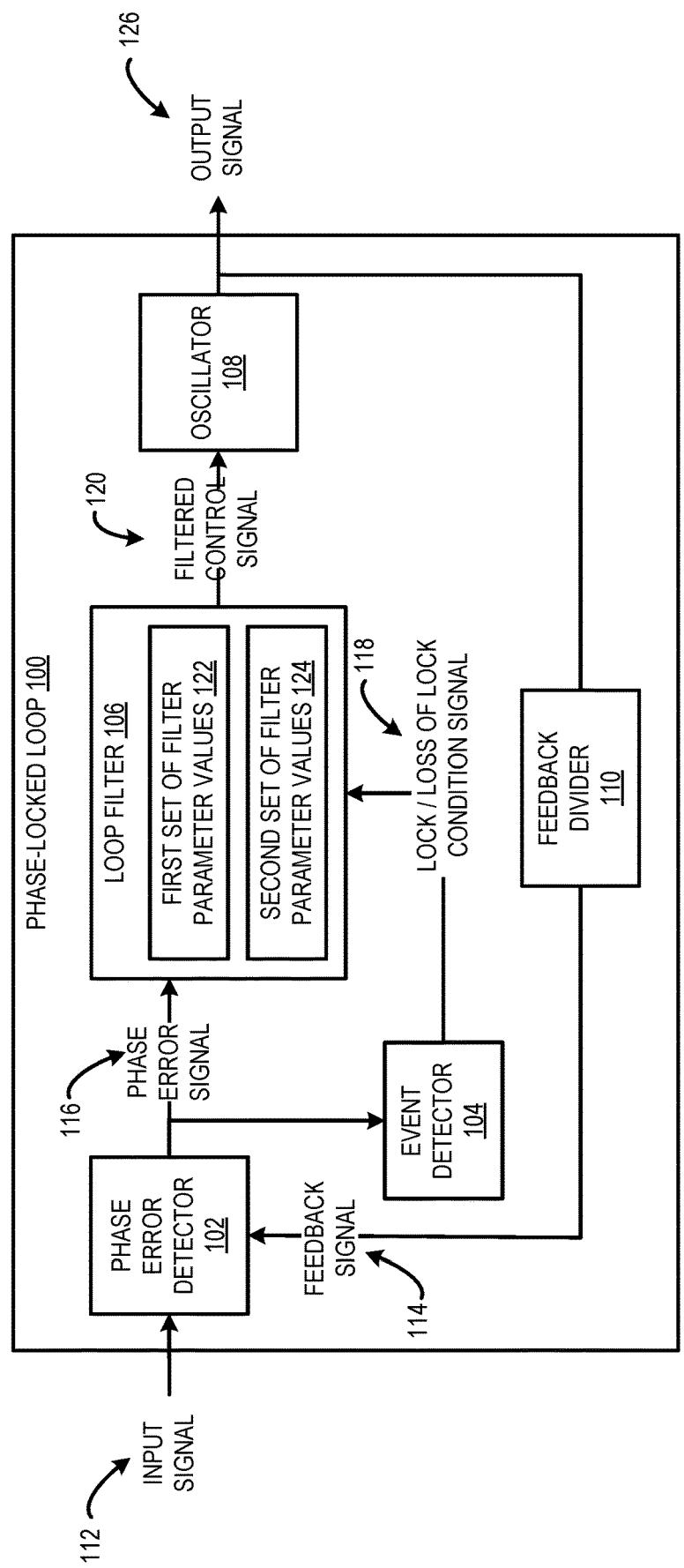
FIG. 1 schematically shows an example phase-locked loop of the present disclosure.

Phase-locked loops (PLLs) are particularly susceptible to radiation events. In general, radiation events, such as Single-Event Effects (SEEs) and Dose Rate Upsets (DRUs), can perturb the output clock stability of a PLL, even to the point of throwing the PLL circuit out of convergence and corrupting the phase alignment of the PLL output and reference input (a.k.a. "loss of lock"). Such a loss of lock can cause an engendering of a limit cycle or some other type of perturbation condition that is subject to a lengthy lock recovery (e.g., multiple millions of output cycles).

Radiation events can perturb different components in different types of PLLs. As one example, in an analog PLL (A-PLL), analog variable capacitors (varactors) included in a voltage-controlled oscillator (VCO) of the A-PLL are prone to deviations in their normal behavior, as a response to radiation events. As another example, programmable current sources included in a charge pump of an A-PLL can be subject to lengthy transients that occur as a response to radiation events. Such deviation in behavior of these analog components can cause a loss of lock of an A-PLL.

An all-digital PLL (AD-PLL) includes digital components, such as flip-flops and digital logic, which generally have a higher noise immunity relative to corresponding analog components of an A-PLL. The higher noise immunity of the digital components can better tolerate sizable perturbations due to SEEs. However, when a radiation-induced perturbation does register in a digital component of an AD-PLL, the repercussions can be as serious, or even worse, than in A-PLLs. As one example, radiation events can perturb operation of a digital engine or a digitally-controlled oscillator of an AD-PLL up to and including a sign reversal of the arithmetic in the loop filter, which can easily cause a loss of lock of the AD-PLL.

In some instances, an AD-PLL may employ triple-mode redundancy (TMR) or circuit voting as countermeasures to protect against radiation events. These countermeasures are examples of what is referred to as "radiation hardening by design" (RHBD). However, RHBD techniques significantly increase the cost of an AD-PLL and are not viable beyond a certain operating speed threshold, due to their inherent parasitic burden. Moreover, such countermeasures may be efficacious to mitigate SEEs from a single strike of a radiation particle: but ensemble radiation events, such as DRUs, engulf the AD-PLL all at once and can overwhelm such countermeasures, resulting in a perturbation of the output clock stability of the AD-PLL. Thus, pure circuit-oriented measures of RHBD alone may not be a suitable solution for protecting AD-PLLs from loss of lock in many instances.

Accordingly, the present description is directed to a PLL that is configured to detect a loss of lock condition, and adaptively tune operating parameters of the PLL to restore the PLL back to a lock condition with faster dynamic and with less interim phase error than using those operating parameter values normally employed when the PLL is in the lock condition. This PLL provides a unified paradigm not for the prevention, but rather for the detection of radiation events; and the attending performance of mitigation operations in the form of temporary, autonomous "on-demand" tuning of operating parameter values of the PLL, based at least on such detection, to quickly return the PLL back to the lock condition. Moreover, the loss of lock detection and mitigation functionality of the PLL provides an advantageous substitute for many radiation-hardened architecture features, while providing reductions in power consumption, area, complexity, and cost, relative to a radiation hardened PLL that employs conventional radiation-hardened architecture features.

FIG. 1 shows an example embodiment of a PLL 100 of the present disclosure. The PLL 100 includes a phase error detector 102, an event detector 104, a loop filter 106, an oscillator 108, and a feedback divider 110.

The phase error detector 102 is configured to receive an input signal 112 and a feedback signal 114 output by the feedback divider 110. The phase error detector 102 is configured to output a phase error signal 116 reflecting a difference between the phase of the input signal 112 and the feedback signal 114.

The phase error detector 102 may embody different forms. In most embodiments, the phase error detector 102 includes a phase detector that is configured to compare a phase of the input signal 112 and the feedback signal 114 and output the phase error signal 116 that represents a difference in phase between the two signals.

In some embodiments, the phase error detector 102 is limited to a frequency detector that is configured only to compare a frequency of the input signal 112 and the feedback signal 114, and output the phase error signal 116 that represents only a difference in frequency (phase's derivative) between the two signals, and is therefore not sensitive to any static phase differences. Such embodiments are oftentimes labeled FLLs, or Frequency Locked Loops, as a subset of more complete PLLs.

In some embodiments, the phase error detector 102 is implemented as a phase-frequency detector that is specially configured to compare the phase and frequency of the input signal 112 with that of the feedback signal 114 and generate the phase error signal 116 that not only represents the phase difference between the two signals within one oscillation cycle, but is also sensitive to the frequency difference in the longer term. In one example, the phase-frequency detector generates a series of pulses correlated to the input and feedback signals: pulses which are then processed to determine the phase and frequency difference. The phase error detector 102 may take any suitable form depending on the specific application and performance requirements of the PLL 100.

The event detector 104 is configured to receive the phase error signal 116 from the phase error detector 102 and detect whether the PLL 100 is in a lock condition, or a loss of lock condition, based at least on the phase error signal 116. The loss of lock condition can be triggered by a radiation event, such as a SEE or a DRU, that negatively affects the behavior of electronic components within the PLL 100. The event detector 104 is configured to output a lock/loss of lock condition signal 118 that indicates whether the PLL 100 is in the lock condition or the loss of lock condition. When the PLL 100 loses lock, an output signal 126 of the PLL 100 can become unstable and may drift in phase, or frequency and phase. The output signal 126 may also exhibit magnified jitter noise, or other unwanted effects when the PLL 100 loses lock. As such, it is desirable to restore the PLL to the lock condition quickly to diminish these negative effects and preserve the usefulness of the PLL output for as long a time as possible.

In some embodiments, the event detector 104 is configured to detect the loss of lock condition based at least on the phase error signal 116 exceeding a threshold error (or trespassing a threshold guard band). In other words, the event detector 104 can detect an instantaneous perturbation of the lock condition of the PLL 100. In some embodiments, the event detector 104 is configured to detect the loss of lock condition based at least on the phase error signal 116 exceeding an amplitude error threshold, and being monitored for an elapsed time of at least a duration threshold upon returning within the amplitude error threshold. In this case, detection of the loss of lock condition remains instantaneous, but the lock recovery is instead sanctioned only when the PLL 100 maintains a stable output frequency and phase relationship with the input signal 112 for a sustained span of time that is greater than the duration threshold.

The loop filter 106 is configured to receive the phase error signal 116 from the phase error detector 102 and the lock/loss of lock condition signal 118 from the event detector 104.

The loop filter 106 is configured to filter the phase error signal 116 to generate a filtered control signal (or phase control signal) 120. The loop filter 106 can take any suitable form of filter that is configured to steer the oscillator 108 to accelerate or decelerate its oscillation frequency, and thus align with the phase of the input signal 112. In some embodiments, the loop filter 106 is configured as a low-pass filter. In some embodiments, the loop filter 106 is configured as a proportional-integral filter that is configured to substantially average the phase error signal 116 to generate the filtered signal 120.

The loop filter 106 is configured to filter the phase error signal 116 to generate the filtered control signal 120 based at least on a first set of one or more filter parameter values 122, when the PLL 100 is in the lock condition. In response to the loss of lock condition, the loop filter 106 is configured to filter the phase error signal 116 to generate the filtered control signal 120 based at least on a second set of one or more filter parameter values 124, different from the first set of one or more filter parameter values 122. In other words, the first set of one or more filter parameter values 122 is tuned for optimal performance during normal operation of the PLL 100 in the lock condition. The second set of one or more filter parameter values 124, while potentially suboptimal for normal operation in the lock condition, is configured to restore the PLL 100 back to a lock condition faster than the first set of one or more parameter values 122. The PLL 100 uses the second set of one or more filter parameter values 124 to adaptively adjust the loop gain and pole-zero singularities with as fast a dynamics as possible, to accelerate restoration of the PLL 100 to the lock condition. The use of the second set of one or more filter parameter values 124 by the loop filter 106 is meant to be temporary until the lock condition is restored; then the loop filter 106 can switch back to using the first set of filter parameter values 122 (or another different set of one or more filter parameter values, depending on operating conditions and/or external programming).

The loop filter 106 can be configured to adjust to any suitable filter parameter value(s), in response to the loss of lock condition, in order to accelerate recovery of the lock condition. In some embodiments, the first set of one or more filter parameter values 122 and the second set of one or more filter parameter values 124 correspond to one or more of a proportional coefficient (alpha) and an integral coefficient (beta) of the loop filter 106. In some instances, the loop filter 106 is configured to adjust the alpha value in response to the loss of lock condition. In some instances, the loop filter 106 is configured to adjust the beta value in response to the loss of lock condition. In some instances, the loop filter 106 is configured to adjust both the alpha value and the beta value in response to the loss of lock condition. In some embodiments, the PLL 100 may be configured to adjust other parameter values altogether to adjust its behavior in response to a loss of lock.

In some instances where a radiation event has caused degradation of an electronic component of the PLL 100, the loop filter 106 may be configured to use a third set of one or more parameter values that is different from the first and second sets, even after the PLL 100 is restored to the lock condition. For example, the third set of one or more parameter values may include an offset that compensates for degradation of one or more electronic components of the PLL 100 ensuing the radiation event.

Figure 2:
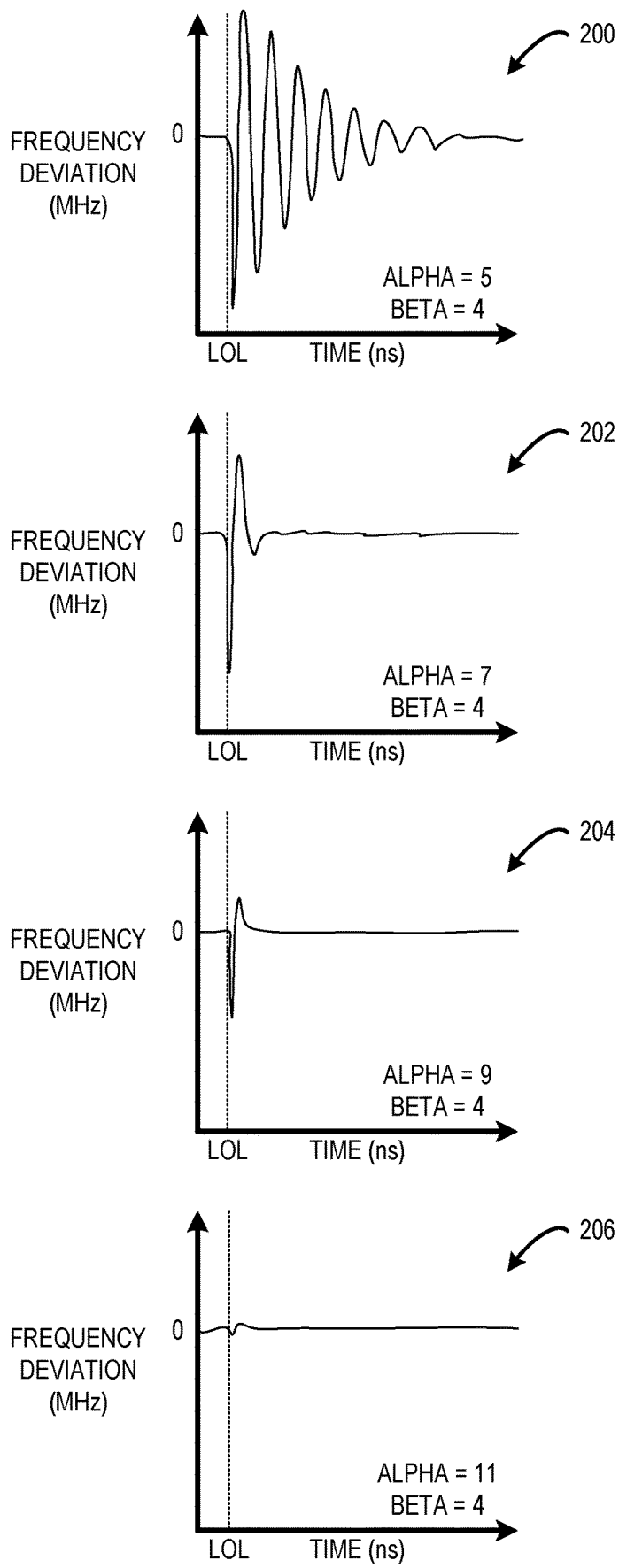
FIG. 2 shows a plurality of plots depicting different example frequency response deviations resulting from different example values of proportional coefficients of the phase-locked loop of FIG. 1.

FIG. 2 shows a plurality of plots 200-206 depicting different example frequency response deviations resulting from different example values of proportional coefficients of the phase-locked loop of FIG. 1. For each of the plurality of plots 200-206 the integral coefficient or beta value is set to 4, to show exclusively the effects of varying the alpha value. Note that in practice, one or both of the alpha value and beta value may be adjusted in response to a loss of lock condition.

Plot 200 depicts a frequency response deviation caused by an alpha value set to 5 and a beta value set to 4. For example, this set of filter parameter values may be optimized for use during a lock condition of the PLL. However, once loss of lock (LOL) occurs, this set of filter parameter values produces a ringing effect that can actually prolong the loss of lock condition.

Plot 202 depicts a frequency response deviation caused by an alpha value set to 7 and a beta value set to 4. In this example, once loss of lock (LOL) occurs, this set of filter parameter values produces a dampened ringing effect relative to that produced by the set of filter parameter values of plot 200. Thus, this set of filter parameter values can restore the lock condition faster than the set of one or more parameter values of plot 200.

Plot 204 depicts a frequency response deviation caused by an alpha value set to 9 and a beta value set to 4. In this example, once loss of lock (LOL) occurs, the set of filter parameter values produces a dampened ringing effect relative to that produced by the set of filter parameter values of plot 202. Thus, this set of filter parameter values can restore the lock condition faster than the set of one or more parameter values of plot 202.

Plot 206 depicts a frequency response deviation caused by an alpha value set to 11 and a beta value set to 4. In this example, once loss of lock (LOL) occurs, this set of filter parameter values produces a very minimal perturbation effect relative to that produced by the set of filter parameter values of plot 204. Thus, this set of filter parameter values can restore the lock condition faster than the set of one or more parameter values of plot 204.

The plurality of plots 200-206 indicate that by increasing the alpha value from 5 to 11 in response to a loss of lock, the PLL may be restored to the lock condition faster than if the alpha value was maintained at 5 subsequent to the loss of lock. In general, a higher alpha value provides higher gain with a wider bandwidth to the PLL that improves precision and speed of lock restoration. However, setting the alpha value too high can speed up the PLL to the point that the loop's zero occurs at too low a frequency in the Bode plot of the PLL loop gain, causing instability. Thus, such an adjustment of the alpha value may be adopted temporarily just en route to restoring the lock condition, and then the alpha value may be adjusted back to 5 (or other optimized alpha value) for normal operation of the PLL once the lock condition has been detected again.

Figure 3:
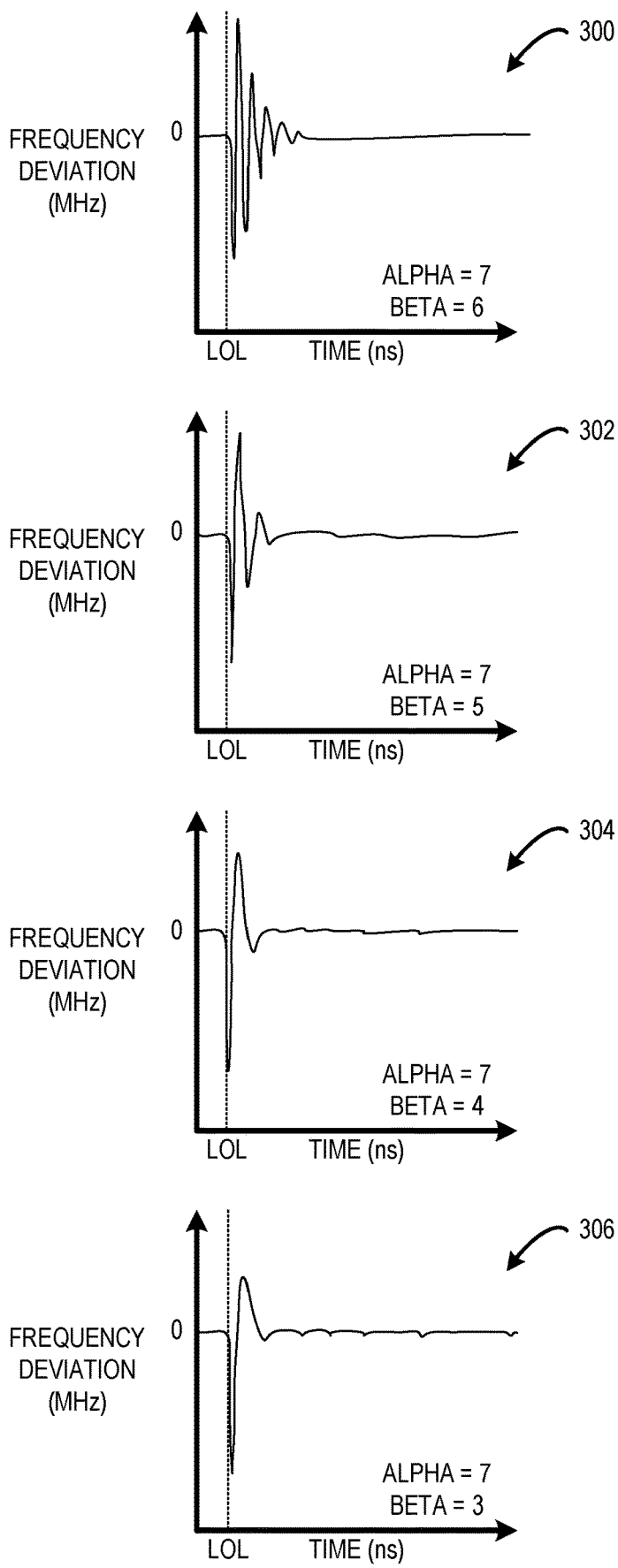
FIG. 3 shows a plurality of plots depicting different example frequency response deviations resulting from different example values of integral coefficients of the phase-locked loop of FIG. 1.

FIG. 3 shows a plurality of plots 300-306 depicting different example frequency response deviations resulting from different example values of integral coefficients of the phase-locked loop of FIG. 1. For each of the plurality of plots 300-306 the proportional coefficient or alpha value is set to 7 to show exclusively the effects of varying the beta value. Note that in practice one or both of the alpha value and beta value may be adjusted in response to a loss of lock condition.

Plot 300 depicts a frequency response deviation caused by an alpha value set to 7 and a beta value set to 6. Once loss of lock (LOL) occurs, this set of filter parameter values produces a ringing effect that can actually prolong the loss of lock condition.

Plot 302 depicts a frequency response deviation caused by an alpha value set to 7 and a beta value set to 5. In this example, once loss of lock (LOL) occurs, this set of filter parameter values produces a dampened ringing effect relative to that produced by the set of filter parameter values of plot 300. Thus, this set of filter parameter values can restore the lock condition faster than the set of one or more parameter values of plot 300.

Plot 304 depicts a frequency response deviation caused by an alpha value set to 7 and a beta value set to 4. In this example, once loss of lock (LOL) occurs, this set of filter parameter values produces a dampened ringing effect relative to that produced by the set of filter parameter values of plot 302. Thus, this set of filter parameter values can restore the lock condition faster than the set of one or more parameter values of plot 302.

Plot 306 depicts a frequency response deviation caused by an alpha value set to 7 and a beta value set to 3. In this example, once loss of lock (LOL) occurs, this set of filter parameter values produces a dampened ringing effect relative to that produced by the set of filter parameter values of plot 304. Thus, this set of filter parameter values can restore the lock condition faster than the set of one or more parameter values of plot 304.

The plurality of plots 300-306 indicate that by decreasing the beta value from 6 to 3 in response to a loss of lock, the PLL may be restored to the lock condition faster than if the beta value was maintained at 6 subsequent to the loss of lock. Such an adjustment of the beta value may be adopted temporarily just en route to restoring the lock condition, and then the beta value may be adjusted back to 6 (or other optimized value) for normal operation once the lock condition of the PLL has been detected again.

The plots 200-206 shown in FIG. 2 and the plots 300-306 shown in FIG. 3 indicate that generally increasing the alpha value and decreasing the beta value can accelerate the restoration of the lock condition of a PLL. However, in some examples, such adjustments can produce other adverse effects.

Figure 4:
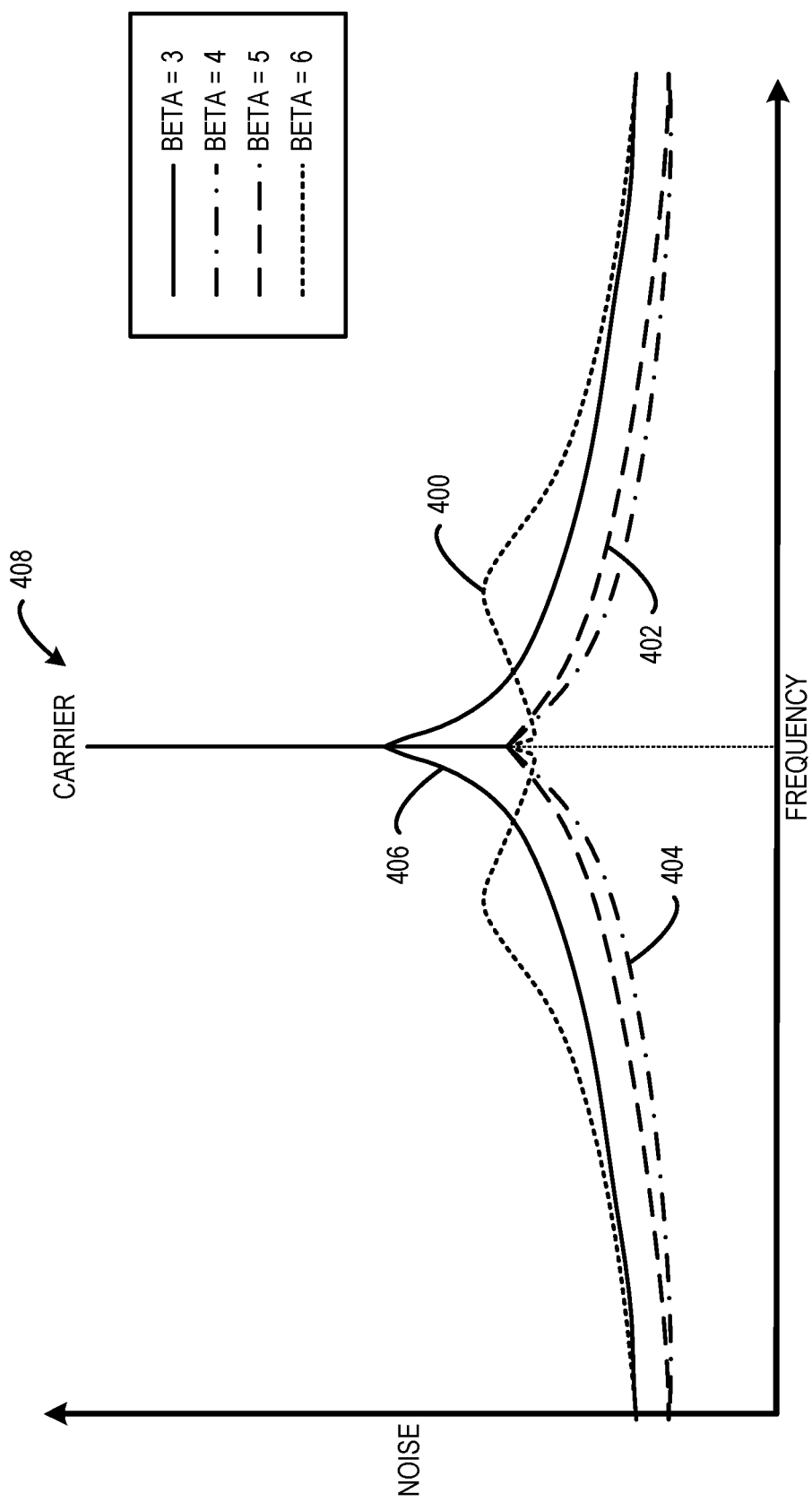
FIG. 4 shows a graph depicting example phase noise curves produced by different example values of integral coefficients of the phase-locked loop of FIG. 1.

FIG. 4 shows a graph depicting example phase noise curves 400-406 produced by different example values of integral coefficients of the phase-locked loop of FIG. 1. Each of the plurality of phase noise curves 400-406 is centered around a carrier frequency 408 of a carrier signal that is being corrupted by the phase noise. Each of the plurality of phase noise curves 400-406 represents the amount of noise affecting the phase of the carrier signal, as a function of frequency deviation away from the carrier. The jitter of a signal corresponds to the integral of the phase noise curve, or the area under the phase noise curve. In other words, the greater the area under the phase noise curve the greater the jitter, which negatively affects the timing stability of the output signal of the PLL. Note that the alpha value is set to 7 for each of the plurality of phase noise curves 400-406.

In the illustrated example, the phase noise curve 400 is produced from a beta value of 6. The phase noise curve 402 is produced from a beta value of 5. The phase noise curve 404 is produced from a beta value of 4. The phase noise curve 406 is produced from a beta value of 3. The signal corresponding to the phase noise curve 400 where the beta value is set to 6 has the greatest amount of jitter (corresponding to the area under the curve) of the signals corresponding to the plurality of phase noise curves 400-406. The signal corresponding to the phase noise curve 402 where the beta value is set to 5 has significantly less jitter than that of the phase noise curve 400. The signal corresponding to the phase noise curve 404 where the beta value is set to 4 has yet less jitter than that of the phase noise curves 400 and 402. However, the signal corresponding to the phase noise curve 406 where the beta value is set to 3 incurred visible noise peaking and suffers from more jitter than that of the phase noise curves 402 and 404. As such, it can be desirable to adjust the beta value to 4 or 5, instead of 3, in response to the loss of lock condition in order to have reduced jitter/improved signal stability while recovering to the lock condition and, more importantly, afterwards in stationary conditions.

Returning to FIG. 1, the loop filter 106 may be configured to adjust the alpha and/or beta values in any suitable manner as to accelerate recovery of the PLL 100 to the lock condition while balancing other factors, such as phase noise, cycle jitter, lock-in time, and wake-up time of the PLL 100.

The loop filter 106 is configured to output the filtered control signal 120 to the oscillator 108. The oscillator 108 is configured to output the output signal 126 which has a frequency and phase that are based at least on the filtered control signal 120. More particularly, the frequency is controlled by the feedback loop of the PLL 100 to ensure that a frequency of the output signal 126 is locked to a frequency of the input signal 112 when in the lock condition. Also, the phase is controlled by adjusting the timing of the output signal 126 relative to the input e 112. The controlled oscillator 108 may take any suitable form, which may depend on the application and the required frequency stability and phase noise performance of the PLL.

The feedback divider 110 is configured to divide the output signal 126 according to a designated feedback division factor to generate the feedback signal 114. For instance, in a frequency multiplier the feedback division factor typically is set to determine the frequency of the output signal 126 as a multiple of the frequency of the input signal 112, in force of the phase and frequency identity between input signal 112 and feedback signal 114 that is enforced by the PLL 100.

The PLL 100 is configured to detect a loss of lock using information generated within the circuit itself, and to adaptively and temporarily tune loop parameter values to adjust the loop gain and pole-zero singularities with a fast dynamics to accelerate restoration of the PLL 100 back to the lock condition.

In some embodiments, the parameters that are adjusted to accelerate restoration of the PLL back to the lock condition can depend on the type and capabilities of the PLL.

Figure 5:
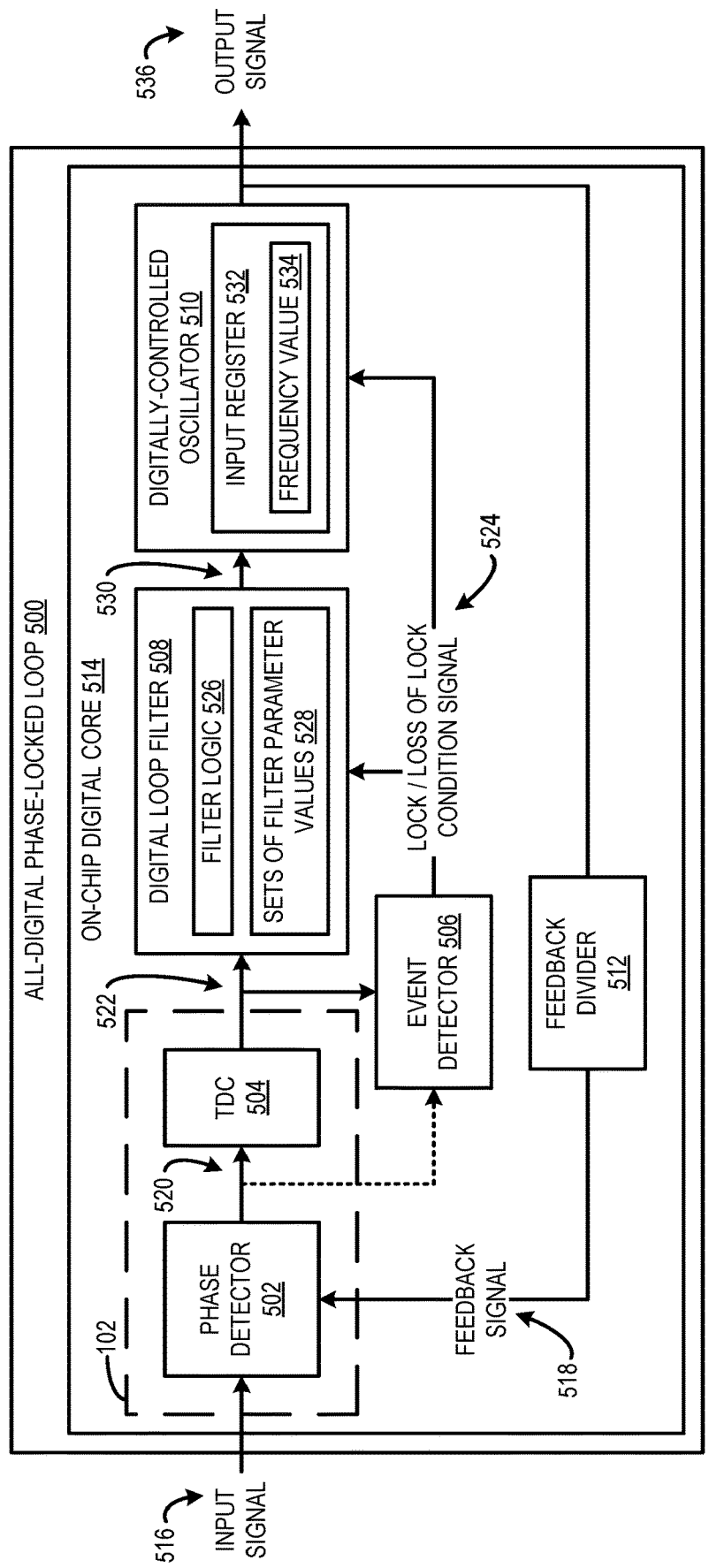
FIG. 5 schematically shows an example all-digital phase-locked loop (AD-PLL) of the present disclosure.

FIG. 5 schematically shows an example AD-PLL 500 of the present disclosure. The AD-PLL 500 includes a phase detector 502, a time-to-digital converter (TDC) 504, an event detector 506, a digital loop filter 508, a digitally-controlled oscillator 510, and a feedback divider 512. These electronic components are co-located on a same integrated core 514 of the AD-PLL 500. The phase detector 502 and the TDC 504 collectively correspond to the phase error detector 102 shown in FIG. 1.

The phase detector 502 is configured to receive an input signal 516 and a feedback signal 518 that is generated from within the AD-PLL 500. The phase detector 502 is configured to compare a phase of the input signal 516 with a phase of the feedback signal 518 and output a phase difference signal 520 that represents the phase difference between the input signal 516 and the feedback signal 518.

The TDC 504 is configured to receive the phase difference signal 520, digitize it, and output it as a digital phase error signal 522 to the event detector 506 and the digital loop filter 508.

The event detector 506 is configured to receive the digital phase error signal 522 from the TDC 504 and detect whether the AD-PLL 500 is in a lock condition, or a loss of lock condition based at least on the digital phase error signal 522. The loss of lock condition can be triggered by a radiation event, such as a SEE or a DRU, that negatively affects the behavior of electronic components of the AD-PLL 500. The event detector 506 is configured to output a lock/loss of lock condition signal 524 that indicates whether the AD-PLL 500 is in the lock condition or the loss of lock condition.

In some embodiments, the event detector 506 is configured to detect the loss of lock condition based at least on the digital phase error signal 522 exceeding an amplitude threshold error (or exceeding an amplitude threshold guard band). In other words, the event detector 506 can detect an instantaneous perturbation of the lock condition of the AD-PLL 500. In some embodiments, the event detector 506 is configured to release the loss of lock condition based at least on the digital phase error signal 522 not exceeding aa amplitude threshold error for a time span of at least a threshold duration. In this case, the detection of the recovery of lock condition is not instantaneous but instead is sanctioned when the AD-PLL 500 has recovered the ability to maintain a stable output frequency and phase relationship with the input signal 516, ascertained along a sustained duration of time that is greater than the threshold duration.

Additionally or alternatively, in some embodiments, the event detector 506 is configured to receive the phase difference signal 520 from the phase detector 502 and output the lock/loss of lock condition signal 524 based at least on the phase difference signal 520. In some embodiments, the event detector 506 is configured to detect the loss of lock condition based at least on the phase difference signal 520 exceeding a threshold phase difference. In some embodiments, the event detector 506 is configured to detect the recovery of lock condition based at least on the phase difference signal 520 not exceeding a threshold phase difference for a time span of at least a threshold duration.

The digital loop filter 508 is configured to receive the digital phase error signal 522 from the TDC 504 and the lock/loss of lock condition signal 524 from the event detector 506. The digital loop filter 508 includes filter logic 526 that establishes a plurality of different sets of filter parameter values 528 to control the AD-PLL under different operating conditions.

In some embodiments, the filter logic 526 is configured to filter the digital phase error signal 522 to generate a digital filtered control signal 530 based at least on a first set of one or more filter parameter values selected from the plurality of sets of filter parameter values 528, and in response to the loss of lock condition, filter the digital phase error signal 522 to generate the digital filtered control signal 530 based at least on a second set of one or more filter parameter values different from the first set of one or more filter parameter values selected from the plurality of sets of filter parameter values 528.

In some embodiments, the filter logic 526 is configured to detect when the digital phase error signal 524 exceeds a plurality of different threshold errors. The plurality of different threshold errors corresponds to a plurality of different sets of one or more filter parameter values 528. In one example, the event detector 506 triggers different digital flags corresponding to the different threshold errors which can be encoded in the lock/loss of lock condition signal 524. The filter logic 526 is configured to select a set of one or more filter parameter values from the plurality of sets 528 based at least on detecting that the phase error signal exceeds a threshold error corresponding to a selected set of one or more filter parameter values. For example, for an error >100-LSB, the filter logic 526 can dictate a normal alpha (=7) and a high beta (=10) for faster accumulation but near-divergence of the loop. Once the error falls below 20-LSB, the beta can be decreased (=4) and alpha can be increased (=11), to maintain a smooth frequency profile. Once the error falls below 5-LSB, the AD-PLL 500 settling can be considered complete and lock is restored, and thus the optimized filter parameter values for lock conditions (e.g., alpha=7 and beta=4) can be reestablished.

The filter logic 526 may take any suitable form that is configured to select a set of filter parameter values from the plurality of different sets of filter parameter values 528 based at least on the lock/loss of lock condition signal 524 indicating that the digital phase error signal 522 exceeds different threshold errors. In one example, the filter logic 526 includes a look-up table that maps different digital phase error signals 522 to different sets of filter parameter values 528. In another example, the filter logic 526 includes a finite state machine that maps different digital phase error signals 522 to different sets of filter parameter values 528. In yet another example, the filter logic 526 includes a trained machine learning model that is configured to determine or select a set of filter parameter values based at least on a sequence of different digital phase error signals 522.

In some embodiments, the filter logic 526 may be configured to determine the error based on a plurality of different operating parameters, such as phase difference, jitter, overshoot/damping/ringing, and set appropriate threshold errors based at least on these different operating parameters. Further, the filter logic 526 may be configured to adjust the filter parameter values based at least on exceeding one or more of these different threshold errors. In some embodiments, the filter logic 526 may include a machine learning model that is configured to receive the plurality of different operating parameters as input and output filter parameter values that are tuned based at least on the plurality of operating parameters.

Since the different electronic components of the AD-PLL 500 are co-located on the same integrated core 514, digital alerts generated by the event detector 506 can be immediately fed into the filter logic 526, and the filter logic 526 can make adaptive adjustments within fractions of a microsecond—which enables corrections to the phase recovery trajectory of the AD-PLL 500 that are faster than other conventional configurations, in which radiation event detection and mitigation are performed on a different off-chip source and the correction is forcibly much less timely.

The digital loop filter 508 may take any suitable form. In some embodiments, the digital loop filter 508 can comprise a finite impulse response filter, or an infinite impulse response filter providing additional poles/zeros. The digital structure of the digital loop filter 508 allows for design flexibility for adding poles and zeros to trade system noise vs. stability. Moreover, the gain of the digital loop filter 508, the tuning of the digitally-controlled oscillator 510, and the division ratio of the feedback divider 512 (i.e., taken as an ensemble: the PLL loop gain) are programmable due to the digital nature of these components. Such programmable loop gain can contribute to a tradeoff of a convergence speed vs. a locking and holding range of the AD-PLL 500.

The digitally-controlled oscillator 510 is configured to receive the digital filtered control signal 530 from the digital loop filter 508 and output an output signal 536 having a frequency (and thus, a phase) that is based at least on the digital filtered control signal 530. More particularly, the frequency of the digitally-controlled oscillator 510 is controlled by the feedback loop of the AD-PLL 500 to ensure that a frequency of the output signal 536 is locked to a frequency of the input signal 516 when in the lock condition.

The digitally-controlled oscillator 510 may take any suitable form of analog circuit. In some embodiments, the digitally-controlled oscillator 510 can be configured as an LC-tank circuit in order to take advantage of the tight resonance of a passive band-pass filter formed within the oscillator circuit, and therefore minimize phase noise injected into the AD-PLL 500 by thermal noise present in the digitally-controlled oscillator 510. In other embodiments, the digitally controlled oscillator 510 can be more simply configured as a ring oscillator.

In some embodiments, the digitally-controlled oscillator 510 includes an input register 532 configured to store a digital frequency value 534 corresponding to a frequency of the output signal 536. The digitally-controlled oscillator 510 is configured to update the digital frequency value 534 corresponding to the frequency of the output signal 536 at each update (often clocked by input signal 516) of the state of digital loop filter 508. The digitally-controlled oscillator 510 is configured to receive the lock/loss of lock condition signal 524 from the event detector 506, and in response to the loss of lock condition, temporarily discontinue updating of the digital frequency value 534 corresponding to the frequency of the output signal 536 in the input register 532 while continuing to output the periodic output signal 536. Such "freezing" of updates to the output register 532 of the digitally-controlled oscillator 510 upon loss of lock while still continuing the issuance of the output signal 536 based at least on the stored frequency value 534 (stored in the input register 532 just until the loss of lock) provides another countermeasure to restore the AD-PLL 500 to the lock condition. Note that this technique defacto opens the feedback loop of AD-PLL as a method of stabilization. In some alternate examples, the adaptive flow as previously described could simply zero out the digital transmission gains (or their scalable analog equivalents), and hence implement such "freezing" state circumvention as a special case of the adaptive algorithm governing the response to a radiation event according to the present disclosure.

The feedback divider 512 is configured to divide the output signal 536 according to a designated feedback division factor to generate the feedback signal 518. For instance, in a frequency multiplier the feedback division factor typically is set to determine the frequency of the output signal 536 as a multiple of the frequency of the input signal 516, in force of the phase and frequency identity between input signal 516 and feedback signal 518 that is enforced by the PLL 500.

Figure 6:
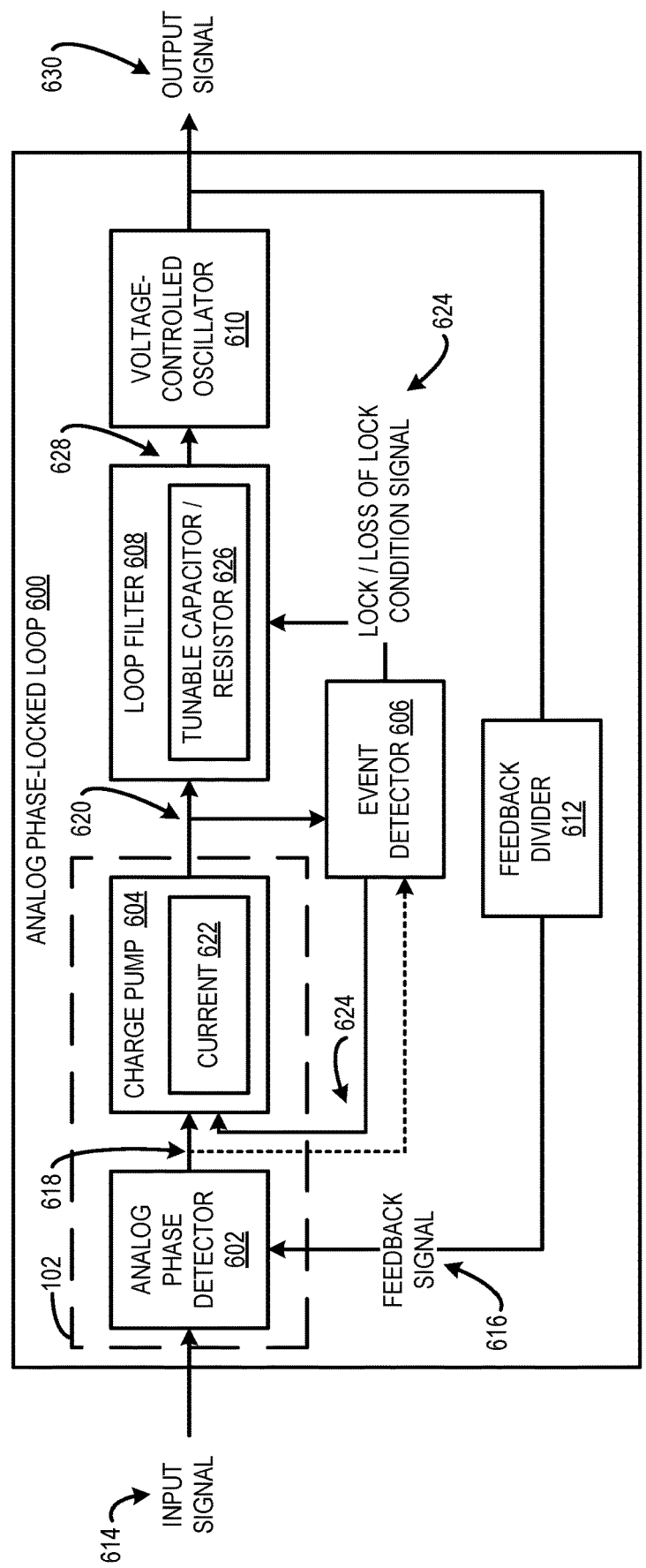
FIG. 6 schematically shows an example analog phase-locked loop (A-PLL) of the present disclosure.

FIG. 6 schematically shows an example analog phase-locked loop (A-PLL) 600 of the present disclosure. The A-PLL 600 includes an analog phase detector 602, charge pump 604, an event detector 606, a loop filter 608, a voltage-controlled oscillator 610, and a feedback divider 612. The analog phase detector 602 and the charge pump 604 collectively correspond to the phase error detector 102 shown in FIG. 1.

The analog phase detector 602 is configured to receive an input signal 614 and a feedback signal 616 that is generated from within the A-PLL 600. The analog phase detector 602 is configured to compare a phase of the input signal 614 with a phase of the feedback signal 616 and output a phase difference signal 618 that represents the phase difference between the input signal 614 and the feedback signal 616. More particularly, the phase difference signal 618 indicates whether the input signal 614 is leading or lagging the feedback signal 616.

The charge pump 604 is configured to convert the phase difference signal 618 into a voltage signal 620 that is used to adjust the frequency of the voltage-controlled oscillator 610. The charge pump 604 provides a high gain and low noise method of adjusting the frequency of the voltage-controlled oscillator 610 via the voltage signal 620. The charge pump 604 also can be designed to provide a linear response, which allows the A-PLL 600 to track changes in the input signal 614 with high accuracy.

The charge pump 604 can take any suitable form. In one example, the charge pump 604 comprises a pair of current sources. When the input signal 614 is leading the feedback signal 616, the charge pump 604 generates a positive current 622 that charges a capacitor inside loop filter 608. When the feedback signal 616 is leading the input signal 614, the charge pump 604 generates a negative current 622 that discharges the same capacitor. Such operation of the charge pump 604 aligns the phase of the input signal 614 with a phase of an output signal 630 of the A-PLL 600.

The event detector 606 is configured to receive the voltage signal 620 from the charge pump 604 and detect whether the A-PLL 600 is in a lock condition, or a loss of lock condition based at least on the voltage signal 620. The loss of lock condition can be triggered by a radiation event, such as a SEE or a DRU, that negatively affects the behavior of electronic components of the A-PLL 600. The event detector 606 is configured to output a lock/loss of lock condition signal 624 that indicates whether the A-PLL 600 is in the lock condition or the loss of lock condition.

In some embodiments, the event detector 606 is configured to detect the loss of lock condition based at least on the voltage signal 620 exceeding a threshold voltage difference (or trespassing a threshold voltage guard band). In other words, the event detector 606 can detect an instantaneous perturbation of the lock condition of the A-PLL 600. In some embodiments, the event detector 606 is configured to release the loss of lock condition based at least on the phase difference signal 618 not exceeding an amplitude threshold error for a time span of at least a threshold duration. In this case, the detection of the recovery of lock condition is not instantaneous but instead is sanctioned when the A-PLL 600 has recovered the ability to maintain a stable output frequency and phase relationship with the input signal 614, ascertained along a sustained duration of time that is greater than the threshold duration.

Additionally or alternatively, in some embodiments, the event detector 606 is configured to receive the phase difference signal 618 from the analog phase detector 602 and output the lock/loss of lock condition signal 624 based at least on the phase difference signal 618. In some embodiments, the event detector 606 is configured to release the loss of lock condition based at least on the phase difference signal 618 not exceeding an amplitude threshold error for a time span of at least a threshold duration. In some embodiments, the event detector 606 is configured to release the loss of lock condition based at least on the phase difference signal 618 not exceeding an amplitude threshold error for a time span of at least a threshold duration. In this case, the detection of the recovery of lock condition is not instantaneous but instead is sanctioned when the AD-PLL 600 has recovered the ability to maintain a stable output frequency and phase relationship with the input signal 614, ascertained along a sustained duration of time that is greater than the threshold duration.

The event detector 606 may take any suitable form. In one example, the event detector 606 includes a comparator circuit that is configured to compare the current 622 of the charge pump 604 relative to a threshold current. In another example, the event detector 606 includes a differential circuit that is configured to monitor up and down phase signals of the analog phase detector 602 to determine a loss of lock condition. In some embodiments, the event detector 606 includes a plurality of window-comparator circuits that can be set to detect different threshold deviations to allow for different levels of adjustment of parameters (e.g., more conservative, or aggressive adjustment depending on the level of phase difference/error) akin to that described with reference to the thresholds implemented by the AD-PLL 500 shown in FIG. 5. Analogously, different window detections can be designed, in principle; and equivalent analog parameters such as current, resistance, or capacitance values can be adaptively adjusted within the loop of A-PLL 600.

In some embodiments where the event detector 606 is configured to determine a loss of lock condition based at least on the phase difference signal 618, the event detector 606 is configured to output the lock/loss of lock condition signal 624 to the charge pump 604. Further, the charge pump 604 is configured to adjust the current 622 based at least on the lock/loss of lock condition signal 624. In one example, the charge pump 604 includes a plurality of selectively activatable current mirrors that can be turned on and off in different combinations to adjust the current 622 of the charge pump 604.

Tuning the current 622 of the charge pump 604 has a direct impact over the loop gain of the A-PLL 600. Specifically, the loop gain of the A-PLL 600 is proportional to the current 622 of the charge pump 604, such that increasing the current 622 increases the loop gain, which improves the tracking performance of the A-PLL 600. However, increasing the current 622 of the charge pump 604 may also increase the noise peaking in the A-PLL 600, which can lead to jitter and other performance issues. Therefore, the charge pump 604 may be configured to temporarily adjust the current 622 to accelerate restoration of the lock condition, and upon restoring lock, revert the current 622 to the previous level that is optimized to balance the loop gain and the noise performance of the A-PLL 600.

The loop filter 608 is configured to receive the lock/loss of lock condition signal 624 from the event detector 606. The loop filter 608 may include a plurality of tunable capacitors and resistors 626 having tunable capacitor and resistor values. The loop filter 608 may be configured to employ a first set of capacitor and resistor values of the tunable capacitors and resistors 626 during normal operation when the A-PLL 600 is in the lock condition to generate a filtered control signal 628 based on the signal 620. In response to loss of lock of the A-PLL 600, the loop filter 608 may be configured to adjust the capacitor and resistor values of the tunable capacitors and resistors 626 to effect adjustment of corresponding alpha and/or beta values of the loop filter 608, to accelerate restoration of the A-PLL 600 back to the lock condition. Such adjustment of the capacitor and resistor values is temporary until lock is restored, and then the loop filter 608 can revert back to the capacitor and resistor normal values optimized for operation in the lock condition.

The voltage-controlled oscillator 610 is configured to generate the output signal 630 based at least on the filtered control signal 628. The output signal 630 has a frequency that is proportional to a voltage of the filtered control signal 628. The voltage-controlled oscillator 610 provides a feedback mechanism that enables the A-PLL 600 to track the phase of the input signal 614 and thus maintain a stable output frequency and phase.23

The feedback divider 612 is configured to divide the output signal 630 according to a designated feedback division factor to generate the feedback signal 616. For instance, in a frequency multiplier the feedback division factor typically is set to determine the frequency of the output signal 630 as a multiple of the frequency of the input signal 614, in force of the phase and frequency identity between input signal 614 and feedback signal 616 that is enforced by the PLL 600.

While in general the A-PLL 600 offers more limited resilience to radiation as compared to the AD-PLL 500 shown in FIG. 5, the flexibility of an external filter, the relative simplicity of the design, and the absence of quantization noise phenomena allows for the A-PLL 600 to be suitable for at least some applications, and provide the radiation event detection and mitigation functionality described herein.

It will be understood that many digital hardening techniques, such as gate sizing, physical RC filtering of the radiation pulses, dual-interleaved signal processing can be applied to both the AD-PLL 500 shown in FIG. 5 and the A-PLL 600 shown in FIG. 6 to further strengthen the hardness of these circuits against radiation events.

Figure 7:
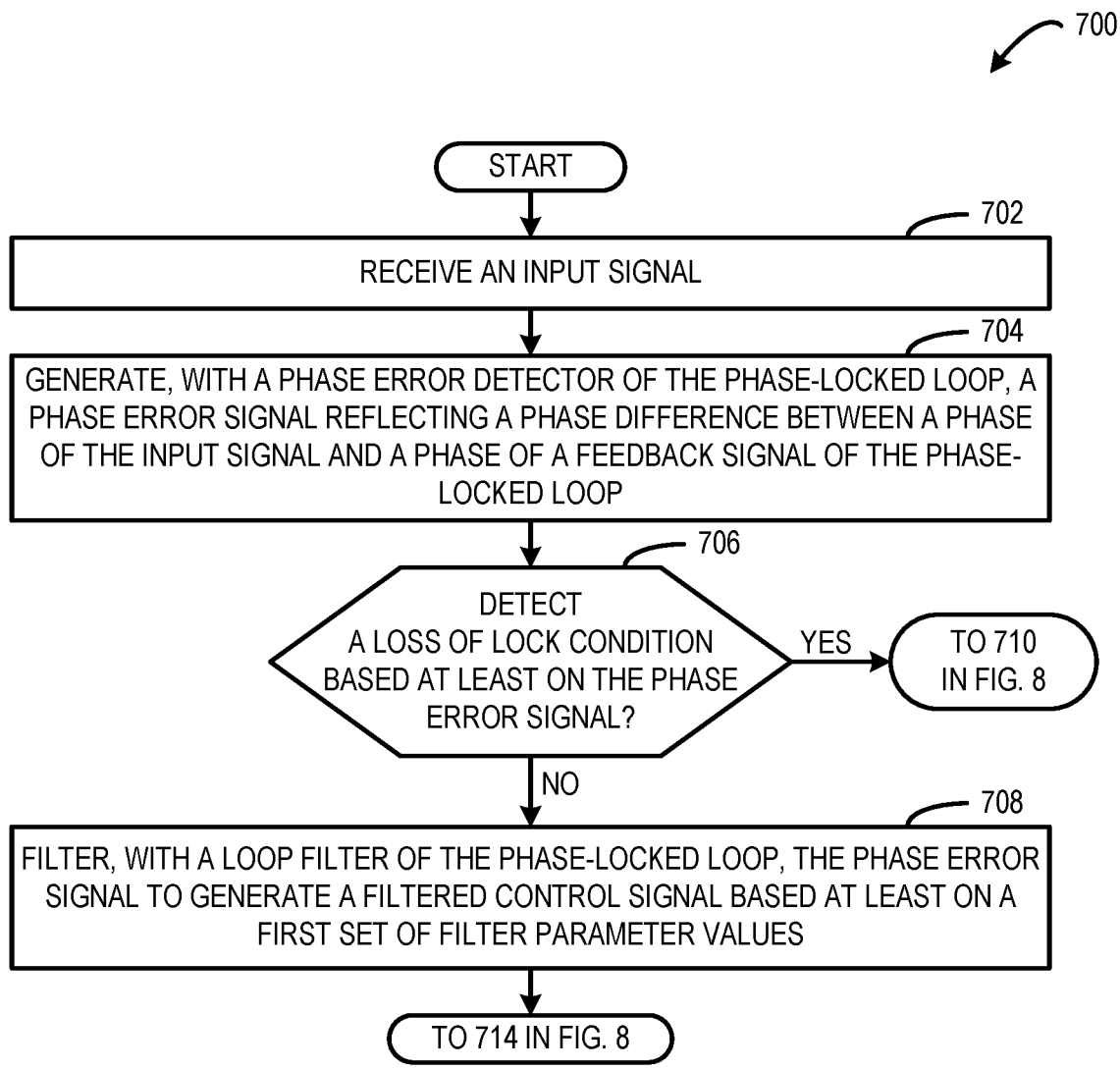
FIGS. 7-8 show a flowchart of an example method for controlling a phase-locked loop of the present disclosure.
Figure 8:
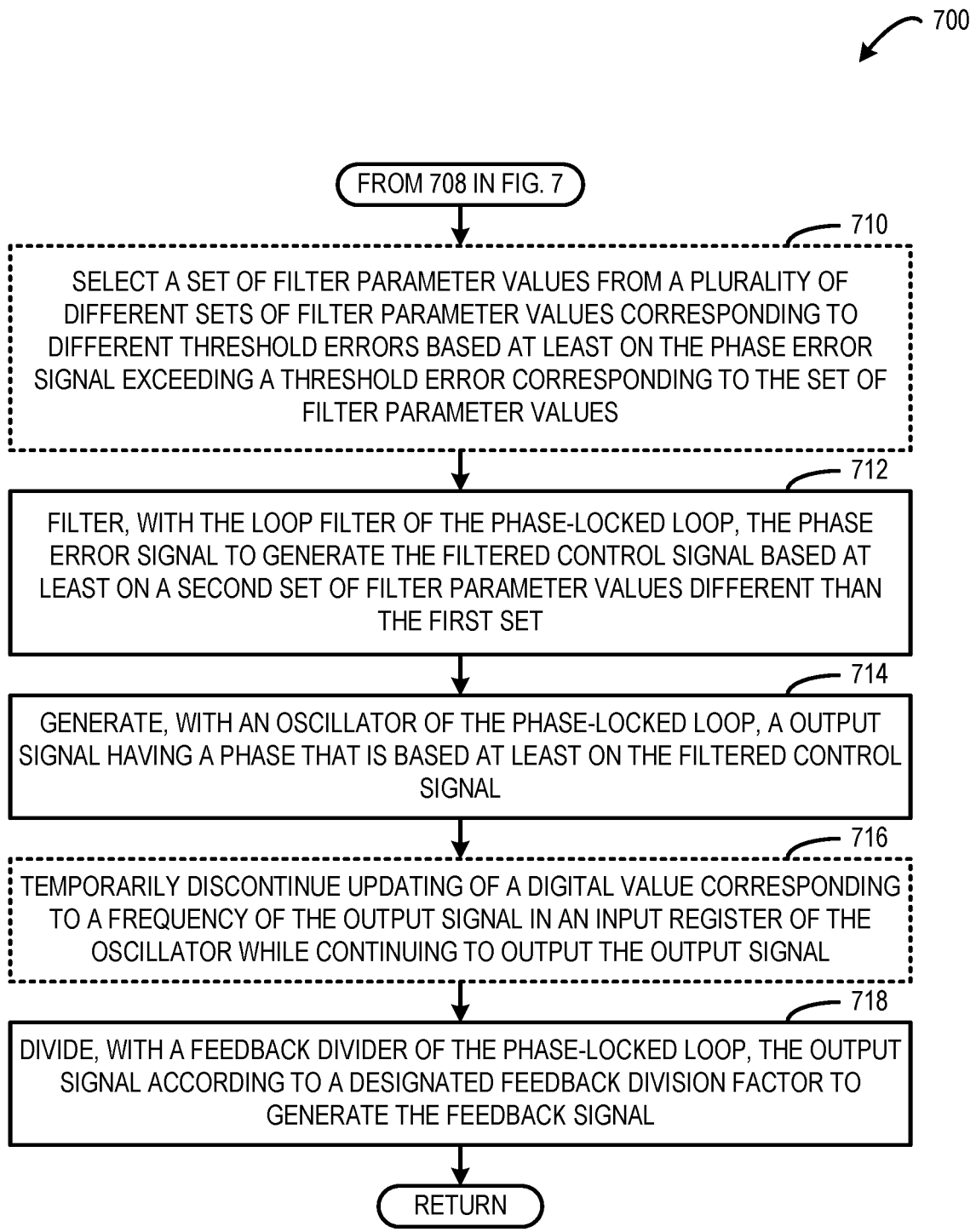

FIGS. 7-8 show a flowchart of an example method 700 for controlling a phase-locked loop of the present disclosure. For example, the method 700 may be performed by any suitable PLL including the PLL 100 shown in FIG. 1, the AD-PLL 500 shown in FIG. 5, and the A-PLL 600 shown in FIG. 6.

At 702, the method 700 includes receiving an input signal.

At 704, the method 700 includes generating, with a phase error detector of the PLL, a phase error signal reflecting a difference between the input signal phase and a feedback signal phase of the PLL. In some embodiments, the difference may reflect a difference in phase, or a difference limited only to frequency.

At 706, the method 700 includes detecting a loss of lock condition based at least on the phase error signal. In some embodiments, the loss of lock condition is detected based at least on the phase error signal exceeding a threshold error. In other embodiments, the loss of lock condition is detected based at least on the phase error signal exceeding a threshold error, and is released based at least on the phase difference signal not exceeding an amplitude threshold error for a time span of at least a threshold duration. If the loss of lock condition is detected, then the method 700 moves to 710 in FIG. 8. Otherwise, the PLL is determined to be in the lock condition, and the method 700 moves to 708.

At 708, the method 700 includes filtering, with a loop filter of the PLL, the error signal to generate a filtered control signal based at least on a first set of filter parameter values. In some embodiments, the filter parameter values correspond to one or more of a proportional coefficient and an integral coefficient of the loop filter. In embodiments where the PLL is an AD-PLL, additionally or alternatively, at least one of the filter parameter values may correspond to a frequency value of an input register of a digitally-controlled oscillator of the AD-PLL. In embodiments where the PLL is an A-PLL, additionally or alternatively, at least one the filter parameter values may correspond to a tunable capacitor value and/or a tunable resistor value of the loop filter. Further, additionally or alternatively, at least one the filter parameter values may correspond to a current of a charge pump of the A-PLL.

In FIG. 8, at 710, in some embodiments where the PLL is an AD-PLL, the method 700 may include detecting when the phase error signal exceeds a plurality of different threshold errors and selecting a set of one or more filter parameter values from a plurality of sets based at least on detecting that the phase error signal exceeds a threshold error corresponding to the selected set of one or more filter parameter values. The selected set of one or more filter parameter values is configured to restore the PLL back to a lock condition faster than the first set of one or more parameter values used during operation of the PLL in the lock condition.

At 712, the method 700 includes filtering, with the loop filter of the PLL, the phase error signal to generate a filtered control signal based at least on the selected set of one or more filter parameter values.

At 714, the method 700 includes generating, with an oscillator of the PLL, an output signal having a phase that is based at least on the filtered control signal.

In some embodiments where the PLL is an AD-PLL including a digitally-controlled oscillator, at 716, the method 700 may include temporarily discontinue updating of a digital frequency value corresponding to a frequency of an output signal in an input register of the digitally-controlled oscillator while continuing to output the output signal. By discontinuing updating of the input register, the value remains what was stored in the register prior to the loss of lock condition and can be used to restore the PLL back to the lock condition upon a timed, estimated termination of the perturbing radiation event.

At 718, the method 700 includes dividing, with a feedback divider of the PLL, the output signal according to a designated feedback division factor to generate the feedback signal.

The method 700 may be performed repeatedly to generate the output signal based at least on the input signal. In iterations of the method 700 subsequent to detecting the loss of lock condition, the method 700 may include detecting a lock condition based at least on the phase error signal, and in response to the lock condition, filtering, with the loop filter of the PLL, the error signal to generate the filtered control signal based at least on the first set of one or more filter parameter values. In other words, once the lock condition is restored, the PLL reverts back to using the first set of parameter values that are optimized for normal operation in the lock condition, assuming that components of the PLL were not permanently degraded due to a radiation event that caused the loss of lock.

The above-described method may be performed to detect a loss of lock condition in a PLL, and adaptively tune operating parameters of the PLL to restore the PLL back to a lock condition faster and with less interim phase error than using operating parameter values normally employed when the PLL is in the lock condition. This PLL provides a unified paradigm not for the prevention, but rather for the detection of radiation events, and the attending performance of mitigation operations in the form of temporary, autonomous "on-demand" tuning of operating parameter values of the PLL based at least on such detection to quickly return the PLL back to the lock condition. Moreover, the loss of lock detection and mitigation functionality of the PLL provides a suitable substitute for many radiation-hardened architecture features, while providing reductions in power consumption, area, complexity, and cost, relative to a radiation hardened PLL that employs such radiation-hardened architecture features.

In an example, a phase-locked loop comprises a phase error detector configured to receive an input signal and a feedback signal of the phase-locked loop and output a phase error signal reflecting a difference between a phase of the input signal and a phase of the feedback signal, an event detector configured to detect a loss of lock condition based at least on the phase error signal, a loop filter configured to filter the phase error signal to generate a filtered control signal based at least on a first set of one or more filter parameter values, and in response to the loss of lock condition, filter the phase error signal to generate the filtered control signal based at least on a second set of one or more filter parameter values different from the first set of one or more filter parameter values, and an oscillator configured to output an output signal having a phase that is based at least on the filtered control signal. In this example and/or other examples, the second set of one or more filter parameter values may be configured to restore the phase-locked loop back to a lock condition faster than the first set of one or more parameter values. In this example and/or other examples, the first set of one or more filter parameter values and the second set of one or more filter parameter values may correspond to one or more of a proportional coefficient and an integral coefficient of the loop filter. In this example and/or other examples, the phase-locked loop may be an all-digital phase-locked loop, the loop filter may be a digital loop filter, and the event detector and the digital loop filter may be co-located on a same integrated core of the phase-locked loop. In this example and/or other examples, the digital loop filter may be configured to detect when the phase error signal exceeds a plurality of different threshold errors, the plurality of different threshold errors may correspond to the plurality of different sets of one or more filter parameter values, and the digital loop filter may be configured to select a set of one or more filter parameter values from the plurality of sets based at least on detecting that the phase error signal exceeds a threshold error corresponding to the selected set of one or more filter parameter values, and generate the filtered control signal based at least on the selected set of one or more filter parameter values. In this example and/or other examples, the oscillator may be a digitally-controlled oscillator including an input register configured to store a digital value corresponding to a frequency of the output signal, the digitally-controlled oscillator may be configured to update the digital value corresponding to a frequency of the output signal at each update of the state of the digital loop filter, and the digitally-controlled oscillator may be configured to, in response to the loss of lock condition, temporarily discontinue updating of the digital value corresponding to the frequency of the output signal in the input register while continuing to output the output signal. In this example and/or other examples, the phase-locked loop may be an analog phase-locked loop including a charge pump, and the charge pump may be configured to receive a signal indicating the loss of lock condition from the event detector, and in response to the loss of lock condition, adjust a current of the charge pump. In this example and/or other examples, the phase-locked loop may be an analog phase-locked loop, the loop filter may include a plurality of tunable capacitors and resistors, and the first set of one or more filter parameter values and the second set of one or more filter parameter values may correspond to capacitance values and resistor values of the plurality of tunable capacitors and resistors of the loop filter. In this example and/or other examples, the event detector may be configured to detect the loss of lock condition based at least on the phase error signal exceeding a threshold error. In this example and/or other examples, the event detector may be configured to detect a lock condition based at least on the phase error signal, and the loop filter may be configured to, in response to the lock condition, filter the phase error signal to generate the filtered control signal based at least on the first set of one or more filter parameter values. In this example and/or other examples, the event detector may be configured to detect a lock condition based at least on the phase error signal, and the loop filter may be configured to, in response to the lock condition, filter the phase error signal to generate the filtered control signal based at least on a third set of one or more filter parameters different from the first set and the second set. In this example and/or other examples, the event detector may be configured to detect the lock condition based at least on the phase error signal falling below the error threshold. In this example and/or other examples, the event detector may be configured to detect the lock condition based at least on the phase error signal falling below the error threshold and there remaining bounded for at least a threshold duration time.

In another example, a method for controlling a phase-locked loop comprises receiving an input signal, generating, with a phase error detector of the phase-locked loop, an error signal reflecting a difference between a phase of the input signal and a phase of a feedback signal of the phase-locked loop; detecting, with an event detector of the phase-locked loop, a loss of lock condition based at least on the phase error signal; filtering, with a loop filter of the phase-locked loop, the phase error signal to generate a filtered control signal based at least on a first set of filter parameter values, and in response to the loss of lock condition, filter the phase error signal to generate the filtered control signal based at least on a second set of filter parameter values different from the first set of filter parameter values; and generating, with an oscillator of the phase-locked loop, a clock signal having a phase that is based at least on the filtered control signal. In this example and/or other examples, the second set of one or more filter parameter values may be configured to restore the phase-locked loop back to a lock condition faster than the first set of one or more parameter values. In this example and/or other examples, the first set of one or more filter parameter values and the second set of one or more filter parameter values may correspond to one or more of a proportional coefficient and an integral coefficient of the loop filter. In this example and/or other examples, the phase-locked loop may be an analog phase-locked loop including a charge pump, and the method may further comprise receiving, at the charge pump, a signal indicating the loss of lock condition from the event detector, and adjusting a current of the charge pump in response to the loss of lock condition. In this example and/or other examples, the method may further comprise, subsequent to detecting the loss of lock condition, detecting a lock condition based at least on the phase error signal; and in response to the lock condition, filtering, with the loop filter of the phase-locked loop, the phase error signal to generate the filtered control signal based at least on the first set of one or more filter parameter values. In this example and/or other examples, detecting the loss of lock condition based at least on the phase error signal may include detecting when the error signal exceeds a plurality of different threshold errors; the plurality of different threshold errors may correspond to a plurality of different sets of one or more filter parameter values, and the method may further comprise 1) selecting a set of one or more filter parameter values from the plurality of sets based at least on detecting that the phase error signal exceeds a threshold error corresponding to the selected set of one or more filter parameter values, and 2) filtering, with the loop filter of the phase-locked loop, the phase error signal to generate the filtered control signal based at least on the selected set of one or more filter parameter values.

In yet another example, a phase-locked loop comprises a phase error detector configured to receive an input signal and a feedback signal of the phase-locked loop and output a phase error signal reflecting a difference between a phase of the input signal and a phase of the feedback signal; an event detector configured to detect a loss of lock condition based at least on the phase error signal; and subsequent to detecting the loss of lock condition, detect a lock condition based at least on the phase error signal; a loop filter configured to filter the phase error signal to generate a filtered control signal based at least on a first set of one or more filter parameter values; and in response to the loss of lock condition, filter the phase error signal to generate a filtered control signal based at least on a second set of one or more filter parameter values different from the first set of one or more filter parameter values; and in response to the subsequent restoring of the lock condition, filter the phase error signal to generate the filtered control signal based at least on a first set of one or more filter parameter values; and an oscillator configured to output an output signal having a phase that is based at least on the filtered control signal.

The present disclosure includes all novel and non-obvious combinations and subcombinations of the various features and techniques disclosed herein. The various features and techniques disclosed herein are not necessarily required of all examples of the present disclosure. Furthermore, the various features and techniques disclosed herein may define patentable subject matter apart from the disclosed examples and may find utility in other implementations not expressly disclosed herein.

The invention claimed is:

1. A phase-locked loop, comprising:
   a phase error detector configured to receive an input signal and a feedback signal of the phase-locked loop and output a phase error signal reflecting a difference between a phase of the input signal and a phase of the feedback signal;
   an event detector configured to detect a loss of lock condition based at least on the phase error signal;
   a loop filter configured to filter the phase error signal to generate a filtered control signal based at least on a first set of one or more filter parameter values, and in response to the loss of lock condition, filter the phase error signal to generate the filtered control signal based at least on a second set of one or more filter parameter values different from the first set of one or more filter parameter values; and
   an oscillator configured to output an output signal having a phase that is based at least on the filtered control signal,
   wherein the event detector is further configured to, subsequent to detecting the loss of lock condition, detect a lock condition based at least on the phase error signal, and
   wherein the loop filter is configured to, in response to the lock condition being detected, filter the phase error signal to generate the filtered control signal based at least on a third set of one or more filter parameter values that are different from the first set and the second set.

2. The phase-locked loop of claim 1, wherein the second set of one or more filter parameter values is configured to restore the phase-locked loop back to the lock condition faster than the first set of one or more parameter values.

3. The phase-locked loop of claim 1, wherein the first set of one or more filter parameter values and the second set of one or more filter parameter values correspond to one or more of a proportional coefficient and an integral coefficient of the loop filter.

4. The phase-locked loop of claim 1, wherein the phase-locked loop is an all-digital phase-locked loop, wherein the loop filter is a digital loop filter, and wherein the event detector and the digital loop filter are co-located on a same integrated core of the phase-locked loop.

5. The phase-locked loop of claim 4, wherein the digital loop filter is configured to detect when the phase error signal exceeds a plurality of different threshold errors, wherein the plurality of different threshold errors correspond to the plurality of different sets of one or more filter parameter values, and wherein the digital loop filter is configured to select a set of one or more filter parameter values from the plurality of sets based at least on detecting that the phase error signal exceeds a threshold error corresponding to the selected set of one or more filter parameter values, and generate the filtered control signal based at least on the selected set of one or more filter parameter values.

6. The phase-locked loop of claim 4, wherein the oscillator is a digitally-controlled oscillator including an input register configured to store a digital value corresponding to a frequency of the output signal, wherein the digitally-controlled oscillator is configured to update the digital value corresponding to a frequency of the output signal at each update of the state of the digital loop filter, and wherein the digitally-controlled oscillator is configured to, in response to the loss of lock condition, temporarily discontinue updating of the digital value corresponding to the frequency of the output signal in the input register while continuing to output the output signal.

7. The phase-locked loop of claim 1, wherein the phase-locked loop is an analog phase-locked loop including a charge pump, and wherein the charge pump is configured to receive a signal indicating the loss of lock condition from the event detector, and in response to the loss of lock condition, adjust a current of the charge pump.

8. The phase-locked loop of claim 1, wherein the phase-locked loop is an analog phase-locked loop, wherein the loop filter includes a plurality of tunable capacitors and resistors, and wherein the first set of one or more filter parameter values and the second set of one or more filter parameter values correspond to capacitance values and resistor values of the plurality of tunable capacitors and resistors of the loop filter.

9. The phase-locked loop of claim 1, wherein the event detector is configured to detect the loss of lock condition based at least on the phase error signal exceeding a threshold error.

10. The phase-locked loop of claim 1, wherein the loop filter is configured to, in response to the lock condition being detected and degradation of no components of the phase-locked loop being detected, filter the phase error signal to generate the filtered control signal based at least on the first set of one or more filter parameter values, and wherein the loop filter is configured to, in response to the lock condition being detected and degradation of a component of the phase-locked loop being detected, filter the phase error signal to generate the filtered control signal based at least on the third set of one or more filter parameter values.

11. The phase-locked loop of claim 1, wherein the event detector is configured to detect the lock condition based at least on the phase error signal falling below an error threshold.

12. The phase-locked loop of claim 1, wherein the event detector is configured to detect the lock condition based at least on the phase error signal falling below an error threshold and there remaining bounded for at least a threshold duration.

13. A method for controlling a phase-locked loop, the method comprising:
receiving an input signal;
generating, with a phase error detector of the phase-locked loop, a phase error signal reflecting a difference between a phase of the input signal and a phase of a feedback signal of the phase-locked loop;
filtering, with a loop filter of the phase-locked loop, the phase error signal to generate a filtered control signal based at least on a first set of filter parameter values;
detecting, with an event detector of the phase-locked loop, a loss of lock condition based at least on the phase error signal;
in response to the loss of lock condition being detected, filtering, with the loop filter of the phase-locked loop, the phase error signal to generate the filtered control signal based at least on a second set of filter parameter values different from the first set of filter parameter values;
subsequent to detecting the loss of lock condition, detecting, with the event detector of the phase-locked loop, a lock condition based at least on the phase error signal;
in response to detecting the lock condition, filtering, with the loop filter of the phase-locked loop, the phase error signal to generate the filtered control signal based at least on a third set of filter parameter values that are different from the first set of filter parameter values and the second set of parameter values; and
generating, with an oscillator of the phase-locked loop, a clock signal having a phase that is based at least on the filtered control signal.

14. The method of claim 13, wherein the second set of one or more filter parameter values is configured to restore the phase-locked loop back to the lock condition faster than the first set of one or more parameter values.

15. The method of claim 13, wherein the first set of one or more filter parameter values and the second set of one or more filter parameter values correspond to one or more of a proportional coefficient and an integral coefficient of the loop filter.

16. The method of claim 13, wherein the phase-locked loop is an analog phase-locked loop including a charge pump, and wherein the method further comprises:
receiving, at the charge pump, a signal indicating the loss of lock condition from the event detector; and
adjusting a current of the charge pump in response to the loss of lock condition.

17. The method of claim 13, further comprising:
in response to the lock condition being detected and degradation of no components of the phase-locked loop being detected, filtering, with the loop filter of the phase-locked loop, the phase error signal to generate the filtered control signal based at least on the first set of one or more filter parameter values; and
in response to the lock condition being detected and degradation of a component of the phase-locked loop being detected, filtering, with the loop filter of the phase-locked loop, the phase error signal to generate the filtered control signal based at least on the third set of one or more filter parameters.

18. The method of claim 13, wherein detecting the loss of lock condition based at least on the phase error signal includes detecting when the error signal exceeds a plurality of different threshold errors, wherein the plurality of different threshold errors correspond to a plurality of different sets of one or more filter parameter values, and wherein the method further comprises 1) selecting a set of one or more filter parameter values from the plurality of sets based at least on detecting that the phase error signal exceeds a threshold error corresponding to the selected set of one or more filter parameter values, and 2) filtering, with the loop filter of the phase-locked loop, the phase error signal to generate the filtered control signal based at least on the selected set of one or more filter parameter values.

19. A phase-locked loop, comprising:
a phase error detector configured to receive an input signal and a feedback signal of the phase-locked loop and output a phase error signal reflecting a difference between a phase of the input signal and a phase of the feedback signal;
an event detector configured to detect a loss of lock condition based at least on the phase error signal, and subsequent to detecting the loss of lock condition, detect a lock condition based at least on the phase error signal;

a loop filter configured to filter the phase error signal to generate a filtered control signal based at least on a first set of one or more filter parameter values, in response to the loss of lock condition being detected, filter the phase error signal to generate a filtered control signal based at least on a second set of one or more filter parameter values different from the first set of one or more filter parameter values to restore the phase-locked loop to the lock condition, in response to the lock condition being detected and degradation of no components of the phase-locked loop not being detected, filter the phase error signal to generate the filtered control signal based at least on the first set of one or more filter parameter values, and in response to the lock condition being detected and degradation of a component of the phase-locked loop being detected, filter the phase error signal to generate the filtered control signal based at least on a third set of one or more filter parameter values that are different from the first set and the second set; and an oscillator configured to output an output signal having a phase that is based at least on the filtered control signal.

20. The phase-locked loop of claim 1, wherein the third set of one or more parameter values includes an offset that compensates for degradation of one or more electronic components of the phase-locked loop.

* * * * *